(12) United States Patent
Ito et al.

(10) Patent No.: US 12,094,522 B2
(45) Date of Patent: Sep. 17, 2024

(54) SEMICONDUCTOR DEVICE HAVING READ DATA BUSES AND WRITE DATA BUSES

(71) Applicant: MICRON TECHNOLOGY, INC., Boise, ID (US)

(72) Inventors: Akeno Ito, Kanagawa (JP); Mamoru Nishizaki, Kanagawa (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 204 days.

(21) Appl. No.: 17/936,785

(22) Filed: Sep. 29, 2022

(65) Prior Publication Data

US 2024/0112725 A1   Apr. 4, 2024

(51) Int. Cl.
*G11C 11/40* (2006.01)
*G11C 11/4091* (2006.01)
*G11C 11/4096* (2006.01)

(52) U.S. Cl.
CPC ...... *G11C 11/4091* (2013.01); *G11C 11/4096* (2013.01)

(58) Field of Classification Search
CPC .......... G11C 11/4091; G11C 11/4096
See application file for complete search history.

(56) References Cited

U.S. PATENT DOCUMENTS

| | | | | |
|---|---|---|---|---|
| 5,594,883 A | * | 1/1997 | Pricer | G06F 12/08 711/144 |
| 5,668,774 A | * | 9/1997 | Furutani | G11C 8/18 365/233.5 |
| 2009/0231945 A1 | * | 9/2009 | Faue | G11C 8/10 365/230.01 |
| 2013/0191687 A1 | * | 7/2013 | Ben-Yehuda | G06F 11/263 714/25 |

* cited by examiner

*Primary Examiner* — Mohammed A Bashar
(74) *Attorney, Agent, or Firm* — Dorsey & Whitney LLP

(57) ABSTRACT

An apparatus that includes: a plurality of first data amplifiers arranged in line in a first direction; a plurality of first read data buses each coupled to a corresponding one of the plurality of first data amplifiers, the plurality of first read data buses having different lengths one another; and a plurality of first write data buses each coupled to the corresponding one of the plurality of first data amplifiers, the plurality of first write data buses having different lengths one another. The plurality of first read data buses and the plurality of first write data buses are alternately arranged in parallel in a second direction vertical to the first direction. The plurality of first read data buses are arranged in longest order and the plurality of first write data buses are arranged in shortest order.

20 Claims, 15 Drawing Sheets

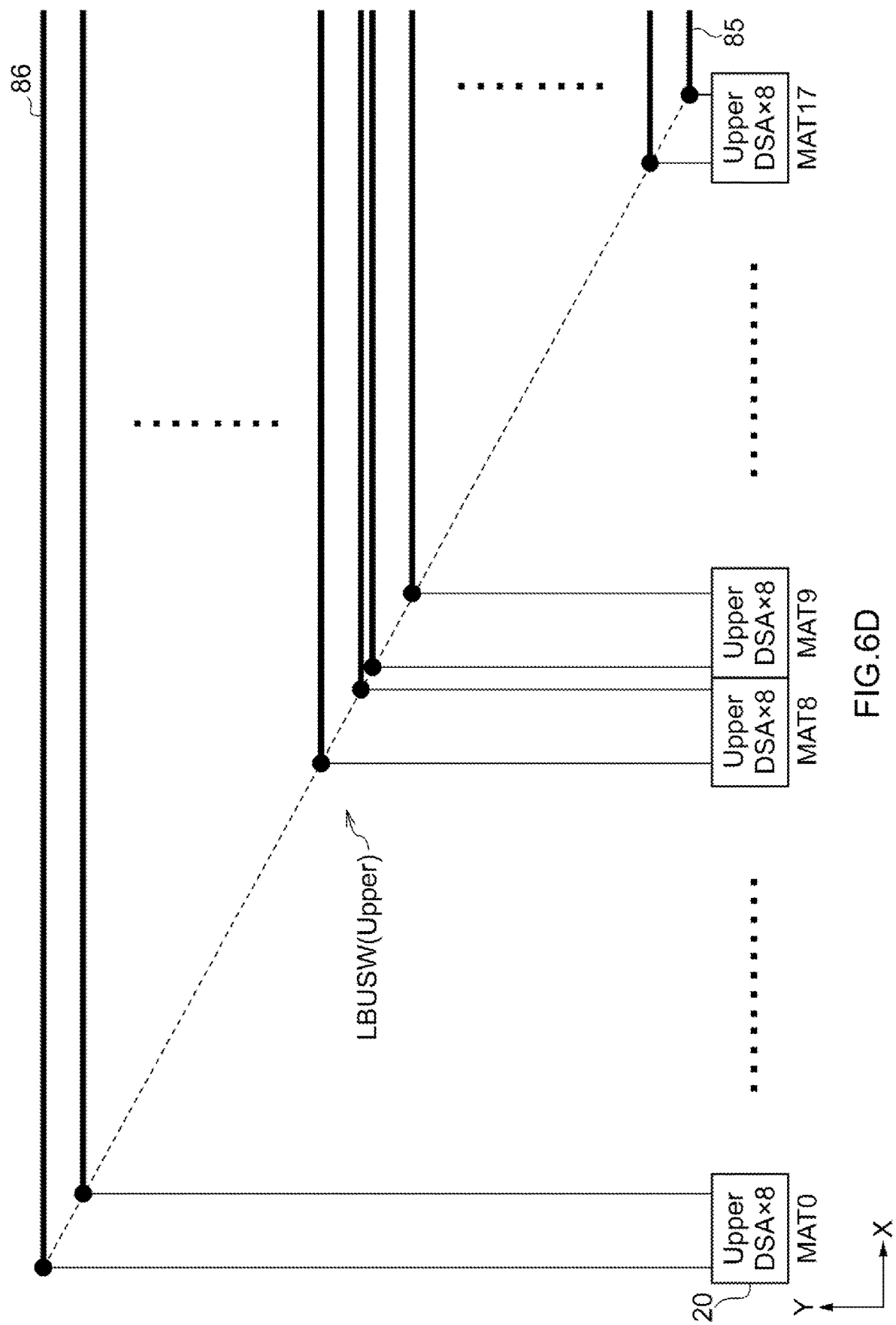

SEMICONDUCTOR DEVICE HAVING READ DATA BUSES AND WRITE DATA BUSES

BACKGROUND

In a semiconductor memory device such as a DRAM, there is a case where read data buses and write data buses are provided separately from each other. The number of read data buses and write data buses may reach hundreds, and how to arrange these buses becomes a problem.

BRIEF DESCRIPTION OF THE DRAWINGS

FIGS. 6C and 6D are schematic diagrams for explaining a layout of the write data buses;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
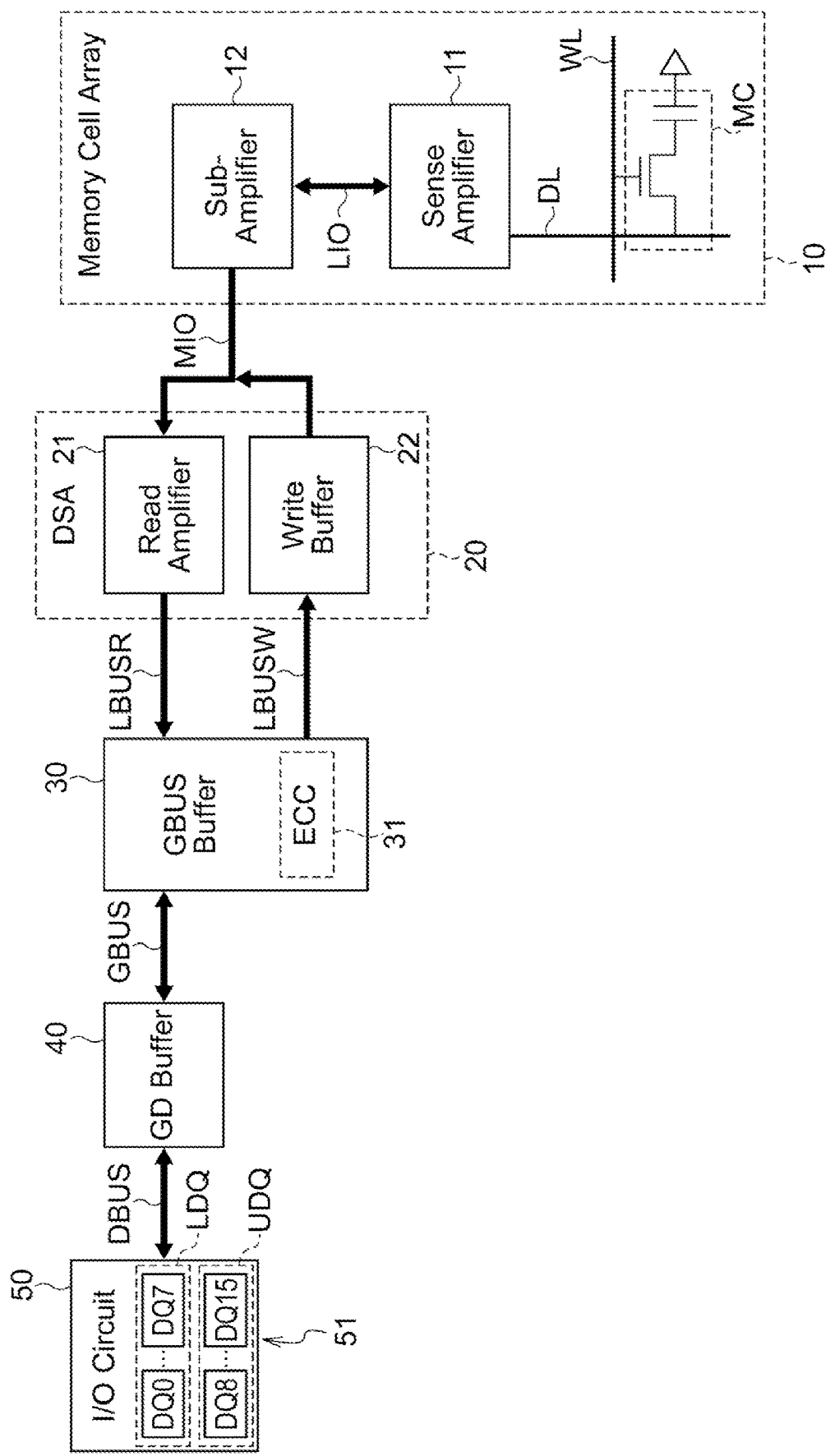
FIG. 1 is a block diagram showing a configuration of a semiconductor memory device according to an embodiment of the present disclosure.

FIG. 1 is a block diagram showing a configuration of a semiconductor memory device according to an embodiment of the present disclosure. The semiconductor memory device shown in FIG. 1 is, for example, a DRAM and includes a memory cell array 10 including a plurality of memory cells MC, an I/O circuit 50 including a plurality of data I/O terminals 51, and a data sense amplifier 20, a GBUS buffer circuit 30, and a GD buffer circuit 40 that are connected between the memory cell array 10 and the I/O circuit 50. The memory cells MC each have a configuration in which a cell capacitor and a cell transistor are connected in series to a digit line DL. A gate electrode of the cell transistor is connected to a word line WL. In a read operation, read data read out from the memory cell MC to the digit line DL is amplified by a sense amplifier 11. The read data amplified by the sense amplifier 11 is supplied to a sub-amplifier 12 via a local I/O line LIO. The sub-amplifier 12 and the data sense amplifier 20 are connected to each other via a main I/O line MIO. The data sense amplifier 20 includes a read amplifier 21 that is active during a read operation and a write buffer 22 that is active during a write operation. In the read operation, the read data amplified by the read amplifier 21 is transferred to the GBUS buffer circuit 30 via a read data bus LBUSR. In the write operation, write data is transferred to the write buffer 22 from the GBUS buffer circuit 30 via a write data bus LBUSW.

The GBUS buffer circuit 30 includes an ECC circuit 31. In a read operation, when read data supplied via the read data bus LBUSR contains an error, the ECC circuit 31 corrects the error with a parity. Accordingly, correct read data in which the error has been corrected is transferred to the GD buffer circuit 40 via a global bus GBUS. The read data transferred to the GD buffer circuit 40 is transferred to the I/O circuit 50 via a data bus DBUS, and read data DQ0 to DQ15 are output from the data I/O terminals 51. Meanwhile, in a write operation, write data DQ0 to DQ15 are input to the data I/O terminals 51. The I/O circuit 50 transfers the write data to the GD buffer circuit 40 via the data bus DBUS. The GD buffer circuit 40 transfers the write data to the GBUS buffer circuit 30 via the global bus GBUS. The GBUS buffer circuit 30 generates a parity by using the ECC circuit 31. The write data and the parity are supplied to the data sense amplifier 20 via the write data bus LBUSW and written to the memory cell array 10. In the present embodiment, 16 data I/O terminals 51 are provided. Among them, data DQ0 to DQ7 configure a Lower DQ (LDQ) group, and data DQ8 to DQ16 configure an Upper DQ (UDQ) group.

Figure 2A:
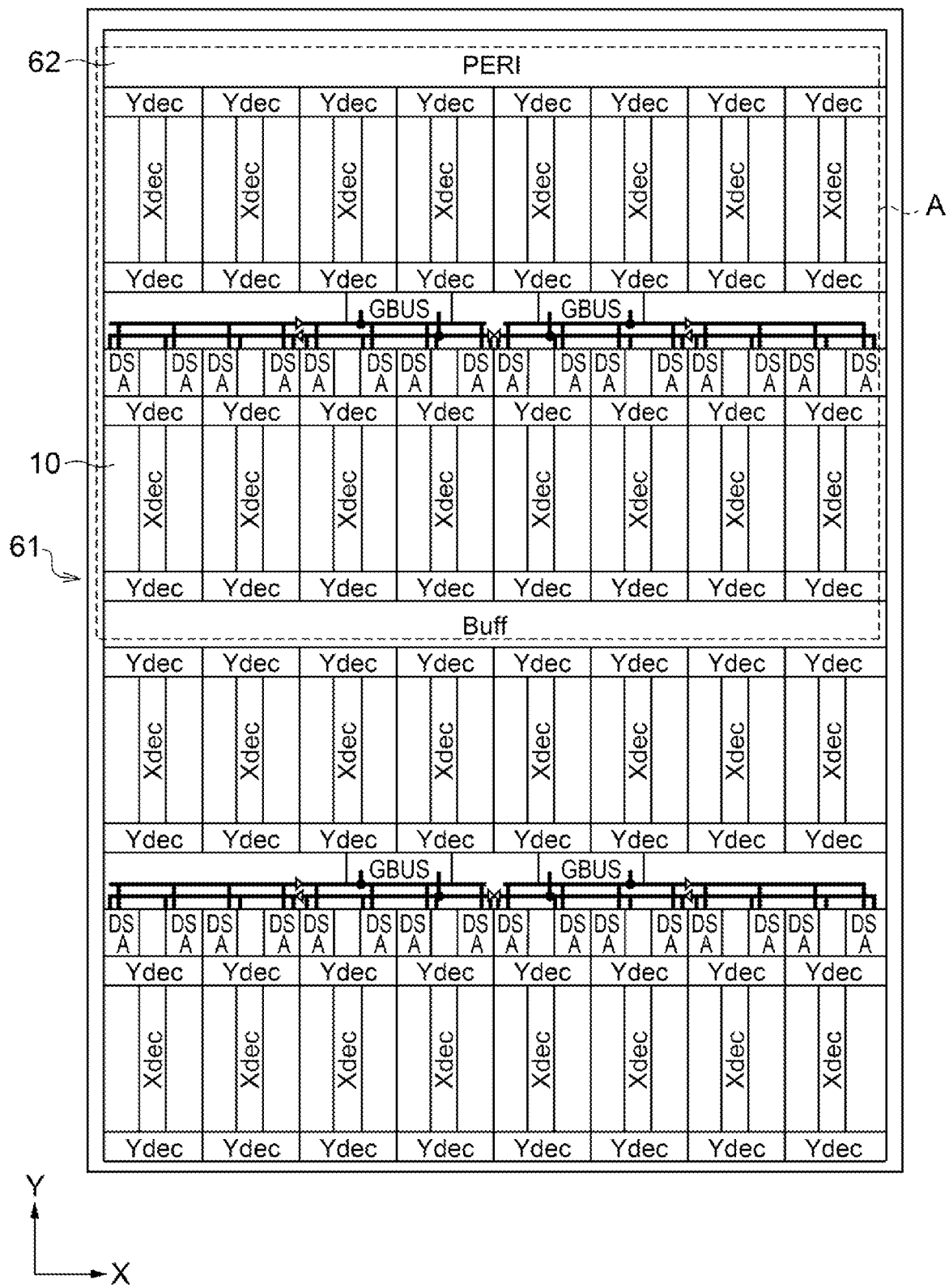
FIG. 2A shows a layout in a semiconductor memory device according to the present embodiment.
Figure 2B:
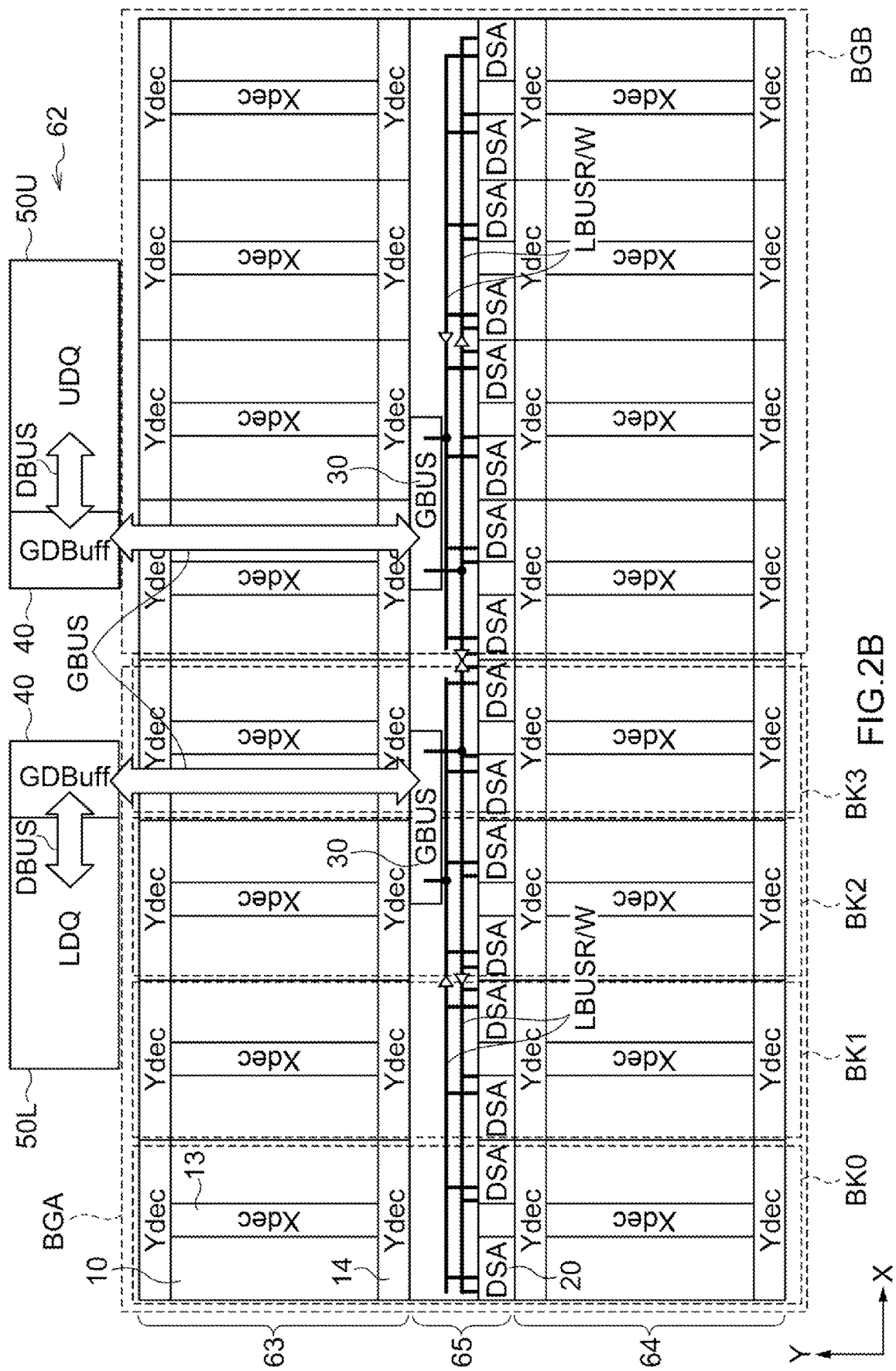
FIG. 2B is an enlarged view of a region A in FIG. 2A.

FIG. 2A shows a layout in a semiconductor memory device according to the present embodiment. FIG. 2B is an enlarged view of a region A in FIG. 2A. As shown in FIG. 2A, the semiconductor memory device according to the present embodiment includes an array region 61 where the memory cell array 10 is arranged and a peripheral circuit region 62. The peripheral circuit region 62 is arranged at an end in the Y-direction of a chip. As shown in FIG. 2B, bank groups BGA and BGB arranged in the X-direction are arranged in the region A shown in FIG. 2A. The bank group BGA includes four memory banks BK0 to BK3. Each of the memory banks BK0 to BK3 includes array regions 63 and 64 and a peripheral circuit region 65. The peripheral circuit region 65 is sandwiched between the array regions 63 and 64 in the Y-direction. The memory cell array 10, a row decoder 13, and a column decoder 14 are arranged in each of the array regions 63 and 64. The data sense amplifier 20, the GBUS buffer circuit 30, the read data bus LBUSR, and the write data bus LBUSW are arranged in the peripheral circuit region 65. The read data bus LBUSR and the write data bus LBUSW extend in the X-direction. The global bus GBUS connecting the GBUS buffer circuit 30 and the GD buffer circuit 40 to each other extends in the Y-direction. The GD buffer circuit 40 and the I/O circuit 50 are arranged in the peripheral circuit region 62. The I/O circuit 50 is divided into a Lower DQ circuit 50L corresponding to the data DQ0 to DQ7 and an Upper DQ circuit 50U corresponding to the data DQ8 to DQ16. Each of the GD buffer circuit 40 and the global bus GBUS is also divided into a part for the Lower DQ circuit 50L and a part for the Upper DQ circuit 50U. The Lower DQ circuit 50L and circuits associated therewith are arranged on the bank group BGA side, and the Upper DQ circuit 50U and circuits associated therewith are arranged on the bank group BGB side. The data bus DBUS extends in the X-direction. In some examples, the X-direction and Y-direction may be perpendicular to one another. Additionally, in some examples, the X-direction may be horizontal; the Y-direction may be vertical.

Figure 3:
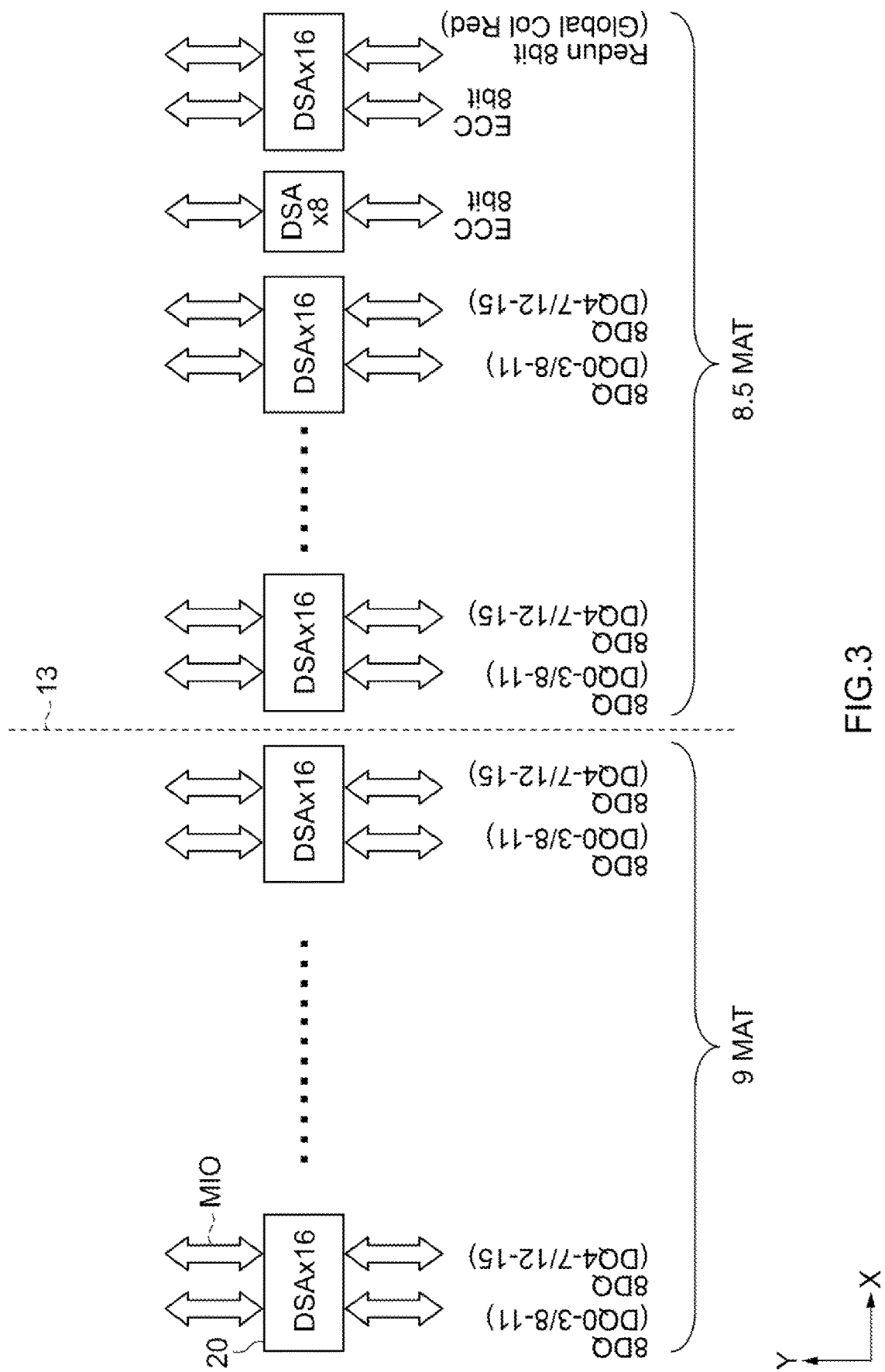
FIG. 3 is a block diagram showing data sense amplifiers included in one memory bank.

The memory cell array 10 includes a plurality of memory mats. By one row access, 17.5 mats are selected from one memory bank. The row access is performed by the row decoder 13. From each of the selected mats, 16-bit data is selected based on a column address. A column access is performed by the column decoder 14. As shown in FIG. 3, 9 mats of the 17.5 mats simultaneously selected are located on one side of the row decoder 13 in the X-direction, and 8.5 mats are located on the other side of the row decoder 13 in the X-direction. The 17.5 mats simultaneously selected are each connected to the corresponding data sense amplifier 20. Each data sense amplifier 20 is shared by the array regions 63 and 64 shown in FIG. 2B. Among the 17.5 mats, 16 mats are used for retaining user data, 0.5 mat is used for retaining an ECC, and 1 mat is used for retaining an ECC and for replacement of a defective bit line. Each of the selected mats inputs/outputs 16-bit data at once. For example, the 16 mats retaining the user data input/output data corresponding to DQ0 to DQ15, respectively. Since 16-bit data per mat is input/output at once as described above, one memory bank requires 280 main I/O lines MIO.

Figure 4A:
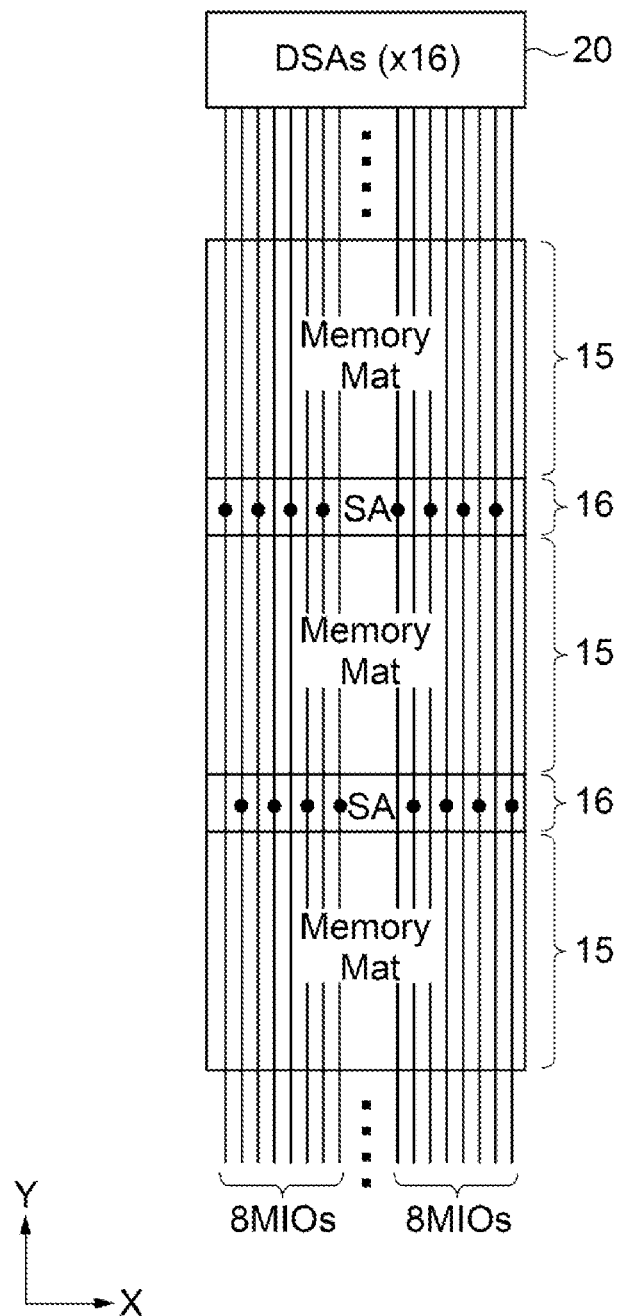
FIGS. 4A to 4C are schematic diagrams for explaining connection between memory mats and the data sense amplifiers.
Figure 4B:
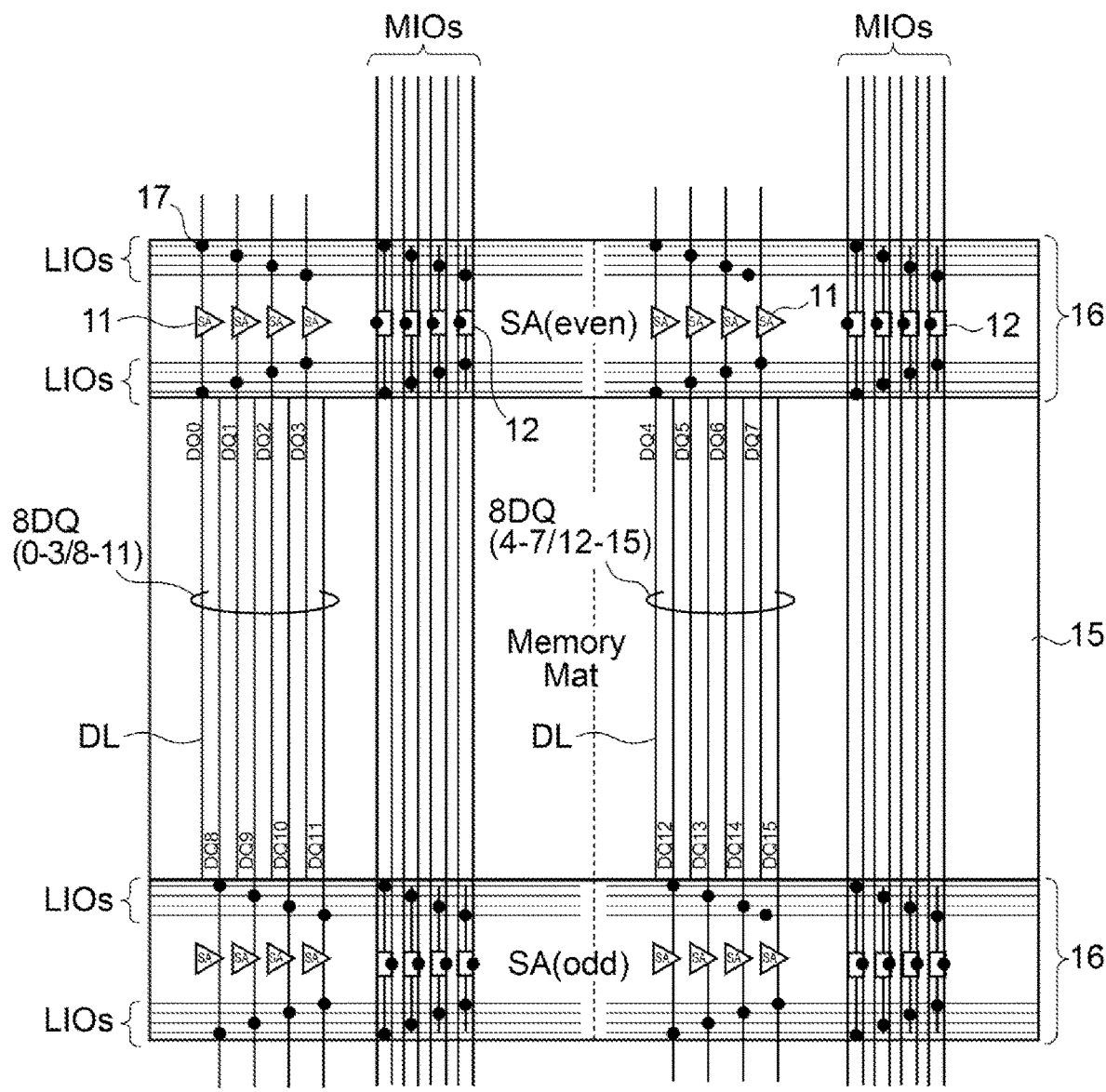
Figure 4C:
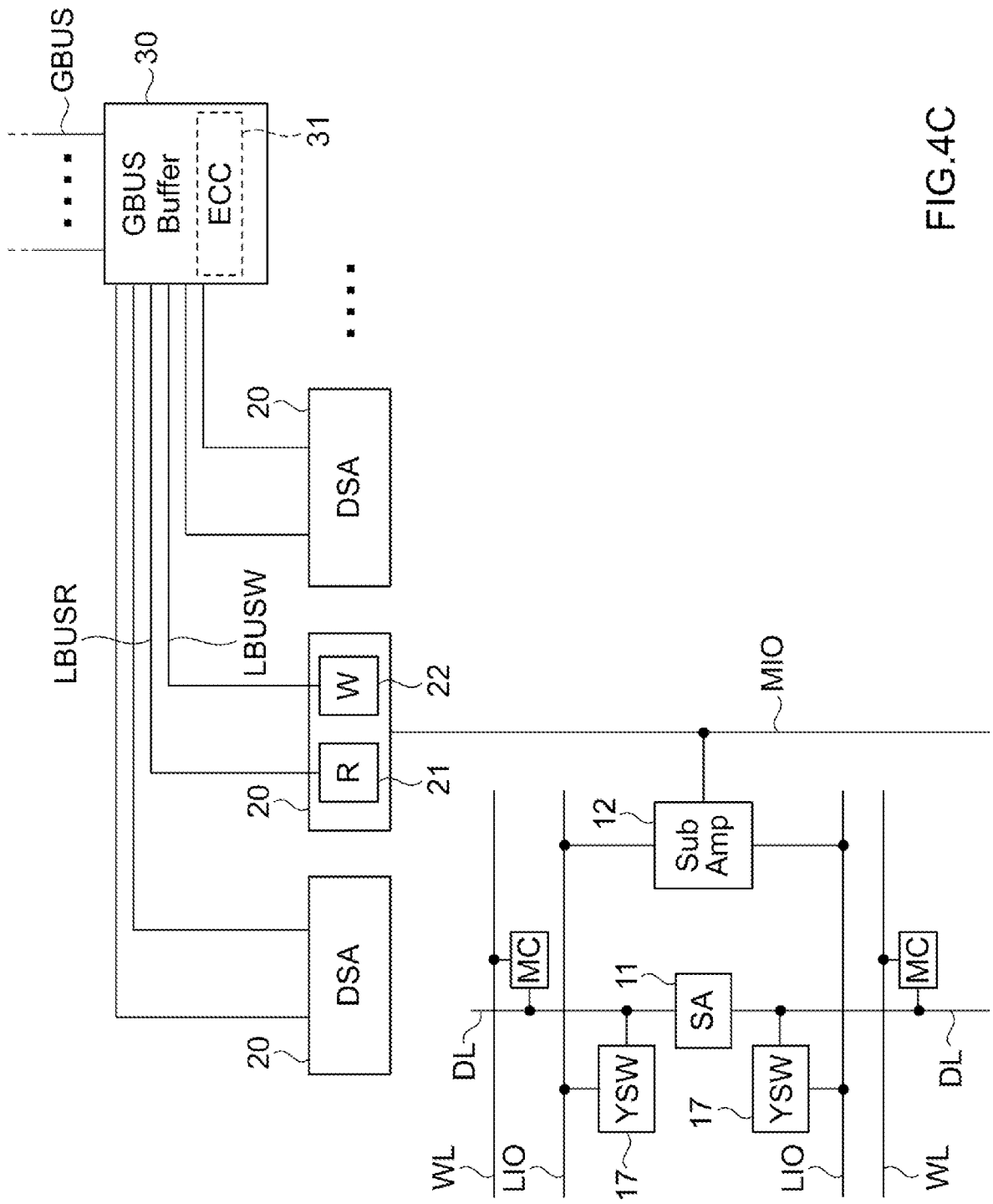

FIGS. 4A to 4C are schematic diagrams for explaining connection between memory mats 15 and the data sense amplifiers 20. As shown in FIG. 4A, a sense amplifier region 16 is arranged on each side of one memory mat 15 in the Y-direction. In the sense amplifier region 16, the sense amplifier 11 and the sub-amplifier 12 shown in FIG. 1 are arranged. Eight main I/O lines MIO are assigned to one sense amplifier region 16. When a certain memory mat 15 is selected based on a row address, the sense amplifier regions 16 on both sides of the selected memory mat 15 in the Y-direction are activated, so that 16-bit data is input/output at once via 16 main I/O lines MIO in total. The 16 main I/O lines MIO are connected to 16 data sense amplifiers 20, respectively. As shown in FIG. 4B, the plural digit lines DL corresponding to DQ0 to DQ15 extend in the Y-direction in the memory mat 15. The digit lines DL are connected to the corresponding sense amplifiers 11, respectively. The digit lines DL are connected to the local I/O lines LIO extending in the X-direction, via column switches 17. The local I/O lines LIO are connected to the main I/O lines MIO extending in the Y-direction, via the sub-amplifiers 12.

As shown in FIG. 4C, the main I/O line MIO is connected to the corresponding data sense amplifier 20. Since 280 main I/O lines MIO are provided for one memory bank as described above, the provided number of data sense amplifiers 20 for one memory bank is also 280. These 280 data sense amplifiers 20 are arranged in the X-direction. As described with reference to FIG. 1, each data sense amplifier 20 includes the read amplifier 21 and the write buffer 22. The read amplifier 21 is connected to the GBUS buffer circuit 30 via the read data bus LBUSR, and the write buffer 22 is connected to the GBUS buffer circuit 30 via the write data bus LBUSW. Therefore, the number of read data buses LBUSR and write data buses LBUSW is 560 per memory bank. The read data buses LBUSR and the write data buses LBUSW the total number of which is 560 are arranged in the peripheral circuit region 65 shown in FIG. 2B. The read data buses LBUSR and the write data buses LBUSW extend mainly in the X-direction.

Figure 5:
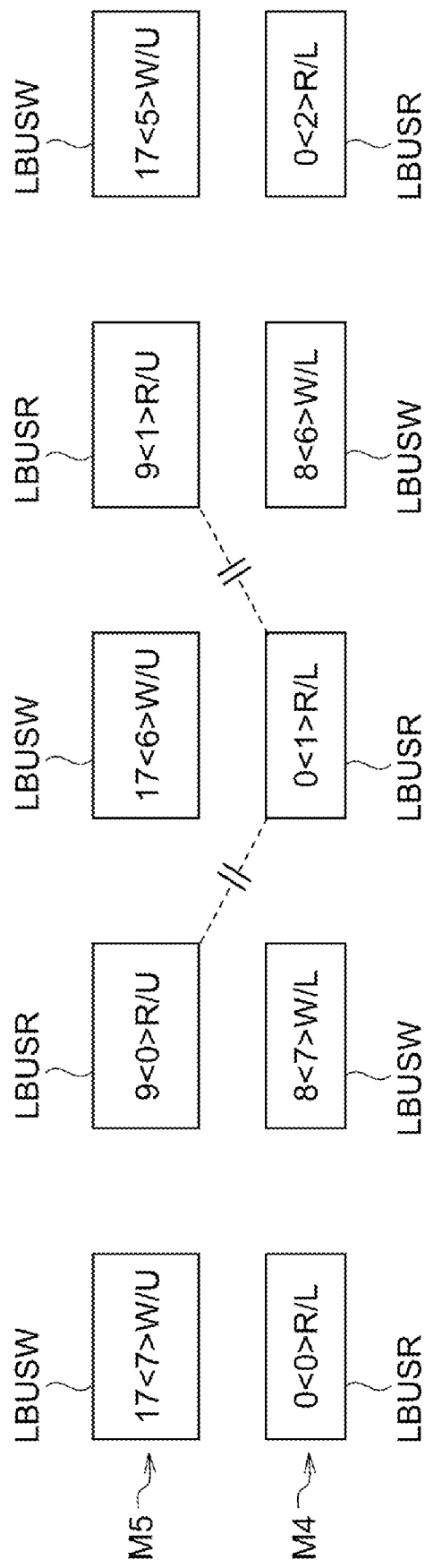
FIG. 5 is a schematic diagram of read data buses and write data buses.

In the present embodiment, a wiring layer having a double layer structure is used in a portion of each of the read data buses LBUSR and the write data buses LBUSW, the portion extending in the X-direction. This is because, if all the read data buses LBUSR and the write data buses LBUSW are arranged in a wiring layer having a single layer structure, the width in the Y-direction of the peripheral circuit region 65 becomes large. By arranging the read data buses LBUSR and the write data buses LBUSW by using a wiring layer having a double layer structure, the width in the Y-direction required for a wiring region can be reduced to about a half. However, when the read data buses LBUSR and the write data buses LBUSW are arranged by using a wiring layer having a double layer structure, the signal quality may be degraded because of coupling occurring between upper and lower wiring layers. In order to prevent this degradation, the read data buses LBUSR and the write data buses LBUSW are arranged to be adjacent to each other in the vertical direction (e.g., in Y direction) and in a planar direction (e.g., in X direction) as shown in FIG. 5, whereby the read data buses LBUSR or the write data buses LBUSW are prevented from being adjacent to each other in the vertical direction and in the planar direction. In some examples, the vertical direction and the planar direction may be perpendicular to each other. With this configuration, coupling between the read data buses LBUSR and coupling between the write data buses LBUSW are reduced. The coupling between the read data buses LBUSR and the coupling between the write data buses LBUSW occur diagonally only. In the example shown in FIG. 5, the read data buses LBUSR and the write data buses LBUSW are wired by using a wiring layer M4 and a wiring layer M5. The wiring layer M5 is located above the wiring layer M4 and has a lower resistance than the wiring layer M4.

Figure 6A:
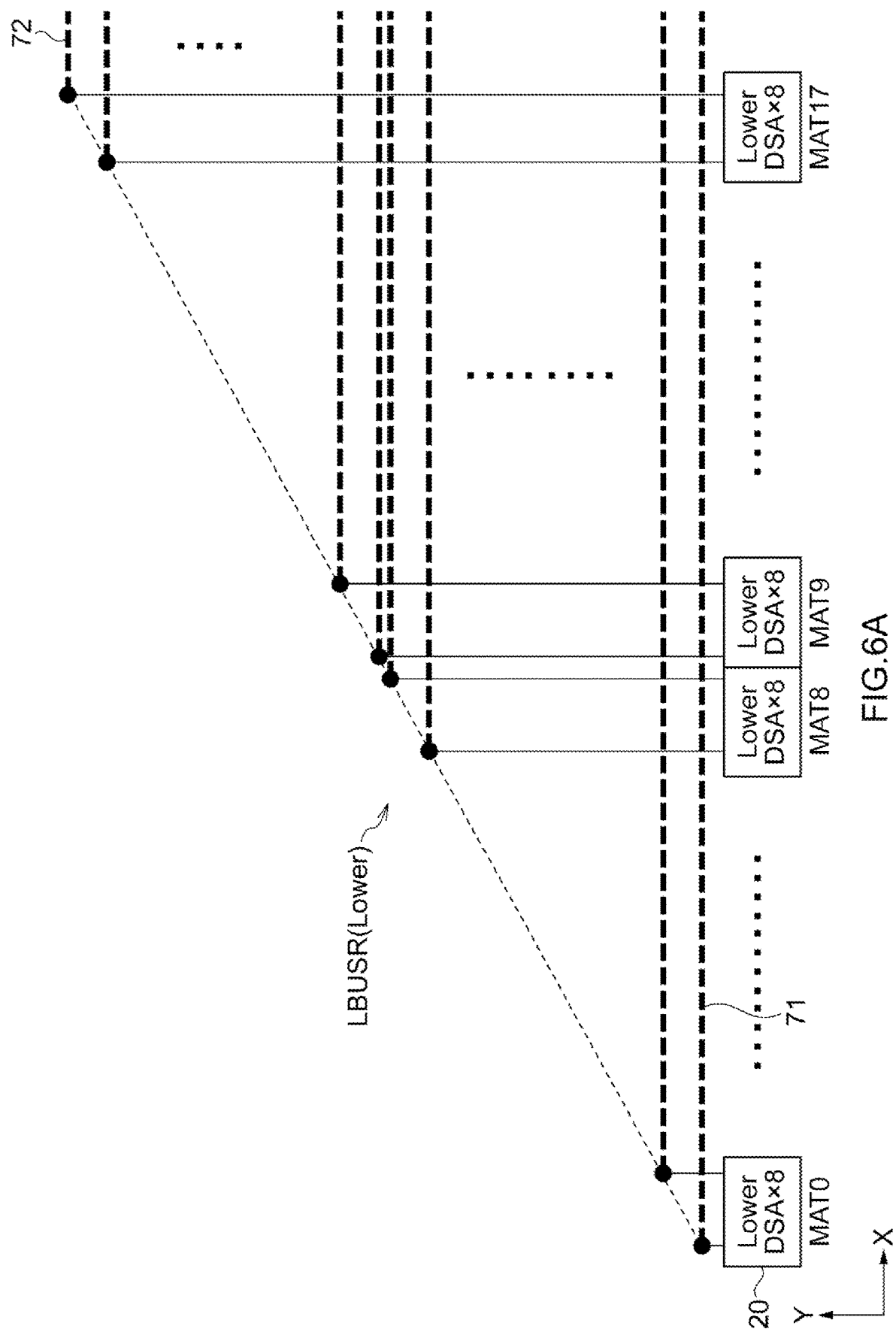
FIGS. 6A and 6B are schematic diagrams for explaining a layout of the read data buses.
Figure 6B:
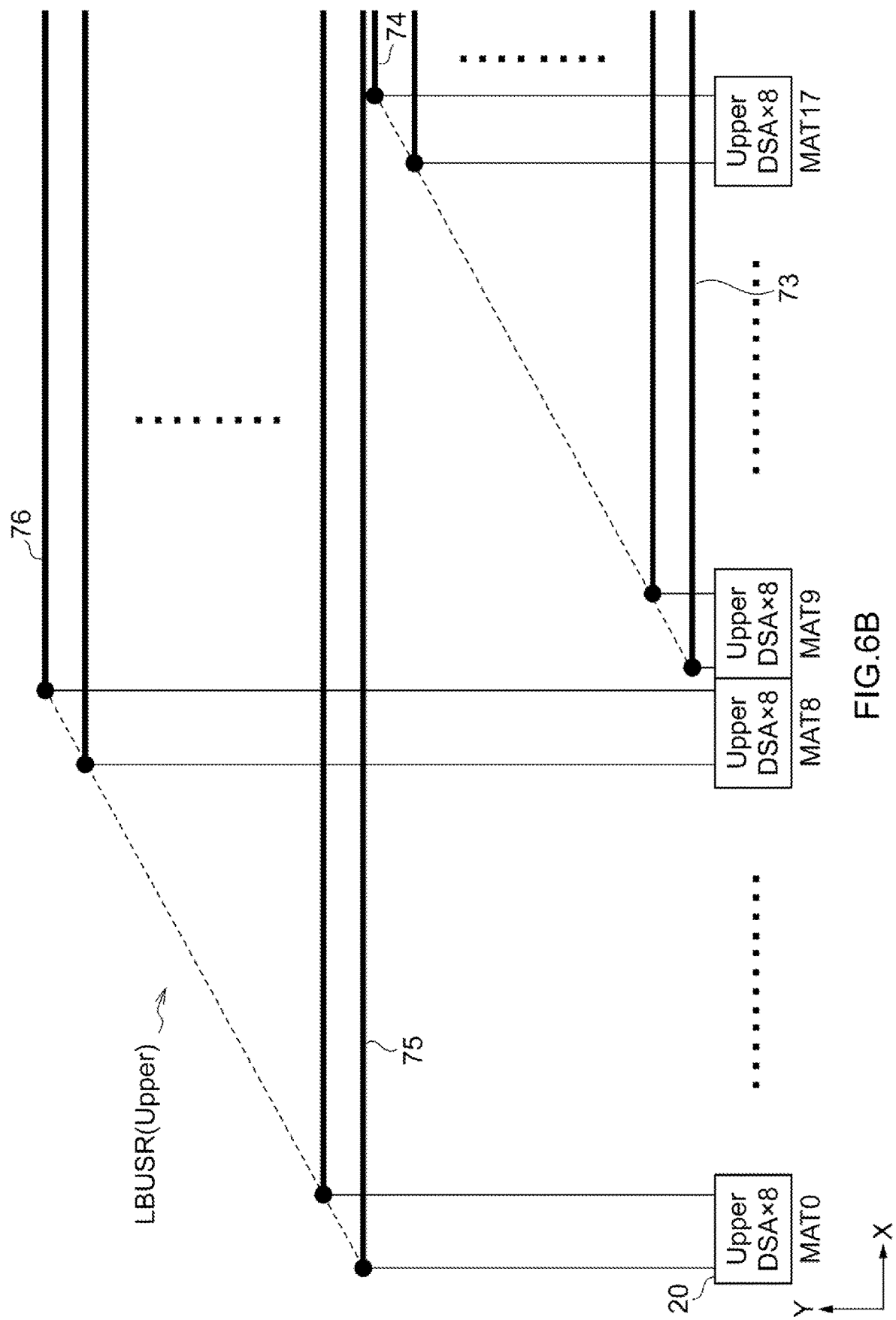
Figure 6C:
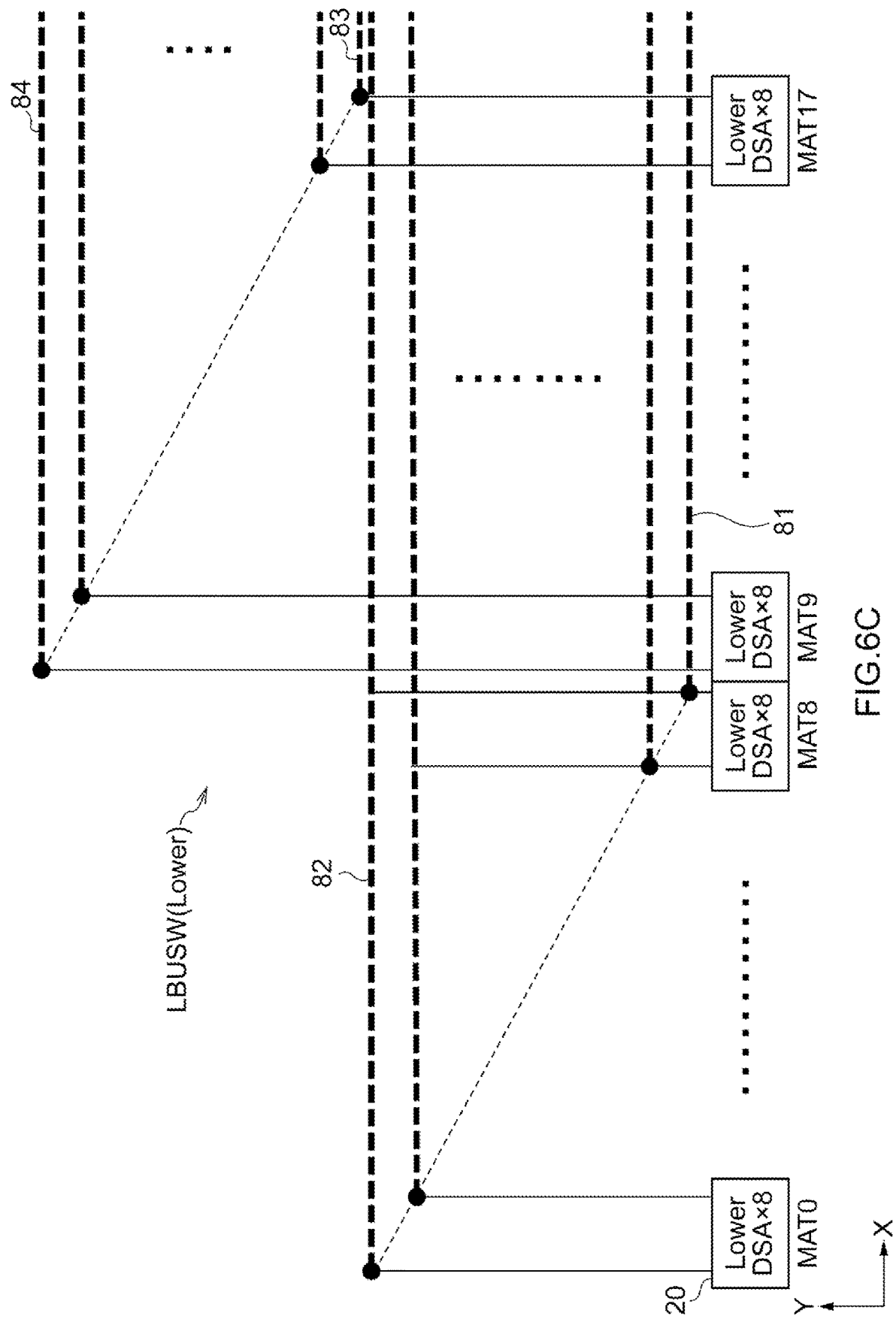

FIGS. 6A and 6B are schematic diagrams for explaining a layout of the read data buses LBUSR assigned to the bank group BGA. FIGS. 6C and 6D are schematic diagrams for explaining a layout of the write data buses LBUSW assigned to the bank group BGA. In FIGS. 6A to 6D, a wire extending in the X-direction and shown with a thick broken line is a wire arranged in the wiring layer M4, and a wire extending in the X-direction and shown with a thick solid line is a wire arranged in the wiring layer M5. Further, a wire extending in the Y-direction and shown with a thin solid line is a wire arranged in a wiring layer M3 that is located below the wiring layer M4.

FIG. 6A shows the data sense amplifiers 20 corresponding to the Lower DQ (DQ0 to DQ7) and the read data buses LBUSR connected thereto. As shown in FIG. 6A, the read data buses LBUSR corresponding to the Lower DQ are all arranged in the wiring layer M4. As for the lengths of the read data buses LBUSR, the read data bus LBUSR corresponding to a memory mat MAT0 is the longest, and the read data bus LBUSR corresponding to a memory mat MAT17 is the shortest. The read data bus may be arranged in an order from longest to shortest from the memory mat MAT0 to the memory mat MAT17. Further, as for the positions in the Y-direction of the read data buses LBUSR, the read data bus LBUSR corresponding to the memory mat MAT0 is the closest to the data sense amplifiers 20, and the read data bus LBUSR corresponding to the memory mat MAT17 is the farthest from the data sense amplifiers 20. The position in the Y-direction of the read data bus LBUSR becomes farther in order from the read data bus LBUSR corresponding to the memory mat MAT0 to the read data bus LBUSR corresponding to the memory mat MAT17. Therefore, the read data buses LBUSR corresponding to the Lower DQ are arranged in the Y-direction in long order from a wire 71 corresponding to the memory mat MAT0 to a wire 72 corresponding to the memory mat MAT17.

FIG. 6B shows the data sense amplifiers 20 corresponding to the Upper DQ (DQ8 to DQ16) and the read data buses LBUSR connected thereto. As shown in FIG. 6B, the read data buses LBUSR corresponding to the Upper DQ are all arranged in the wiring layer M5. As for the lengths of the read data buses LBUSR, the read data bus LBUSR corresponding to the memory mat MAT0 is the longest, and the read data bus LBUSR corresponding to the memory mat MAT17 is the shortest. Further, as for the positions in the Y-direction of the read data buses LBUSR, the read data bus LBUSR corresponding to a memory mat MAT9 is the closest to the data sense amplifiers 20, and the read data bus LBUSR corresponding to a memory mat MAT8 is the farthest from the data sense amplifiers 20. The position in the Y-direction of the read data bus LBUSR becomes farther in order from the read data bus LBUSR corresponding to the memory mat MAT9 to the read data bus LBUSR corresponding to the memory mat MAT17, and further becomes farther in order from the read data bus LBUSR corresponding to the memory mat MAT0 to the read data bus LBUSR corresponding to the memory mat MAT8. Therefore, the read data buses LBUSR corresponding to the Upper DQ are arranged in the Y-direction in long order from a wire 73 corresponding to the memory mat MAT9 to a wire 74 corresponding to the memory mat MAT17, and are arranged in the Y-direction in long order from a wire 75 corresponding to the memory mat MAT0 to a wire 76 corresponding to the memory mat MAT8.

FIG. 6C shows the data sense amplifiers 20 corresponding to the Lower DQ (DQ0 to DQ7) and the write data buses LBUSW connected thereto. As shown in FIG. 6C, the write data buses LBUSW corresponding to the Lower DQ are all arranged in the wiring layer M4. As for the lengths of the write data buses LBUSW, the write data bus LBUSW corresponding to the memory mat MAT0 is the longest, and the write data bus LBUSW corresponding to the memory mat MAT17 is the shortest. Further, as for the positions in the Y-direction of the write data buses LBUSW, the write data bus LBUSW corresponding to the memory mat MAT8 is the closest to the data sense amplifiers 20, and the write data bus LBUSW corresponding to the memory mat MAT9 is the farthest from the data sense amplifiers 20. The position in the Y-direction of the write data bus LBUSW becomes farther in order from the write data bus LBUSW corresponding to the memory mat MAT8 to the write data bus LBUSW corresponding to the memory mat MAT0, and further becomes farther in order from the write data bus LBUSW corresponding to the memory mat MAT17 to the write data bus LBUSW corresponding to the memory mat MAT9. Therefore, the write data buses LBUSW corresponding to the Lower DQ are arranged in the Y-direction (e.g. vertical direction and/or perpendicular to the X-direction) in short order (e.g. from shortest to longest) from a wire 81 corresponding to the memory mat MAT8 to a wire 82 corresponding to the memory mat MAT0, and is arranged in the Y-direction (e.g. vertical direction and/or perpendicular to the X-direction) in short order (e.g. from shortest to longest) from a wire 83 corresponding to the memory mat MAT17 to a wire 84 corresponding to the memory mat MAT9.

FIG. 6D shows the data sense amplifiers 20 corresponding to the Upper DQ (DQ8 to DQ15) and the write data buses LBUSW connected thereto. As shown in FIG. 6D, the write data buses LBUSW corresponding to the Upper DQ are all arranged in the wiring layer M5. As for the lengths of the write data buses LBUSW, the write data bus LBUSW corresponding to the memory mat MAT0 is the longest, and the write data bus LBUSW corresponding to the memory mat MAT17 is the shortest. Further, as for the positions in the Y-direction (e.g., vertical direction and/or perpendicular to the X-direction) of the write data buses LBUSW, the write data bus LBUSW corresponding to the memory mat MAT17 is the closest to the data sense amplifiers 20, and the write data bus LBUSW corresponding to the memory mat MAT0 is the farthest from the data sense amplifiers 20. The position in the Y-direction of the write data bus LBUSW becomes farther in order from the write data bus LBUSW corresponding to the memory mat MAT17 to the write data bus LBUSW corresponding to the memory mat MAT0. Therefore, the write data buses LBUSW corresponding to the Upper DQ are arranged in the Y-direction in short (e.g. from shortest to longest) order from a wire 85 corresponding to the memory mat MAT17 to a wire 86 corresponding to the memory mat MAT0.

Figure 7A:
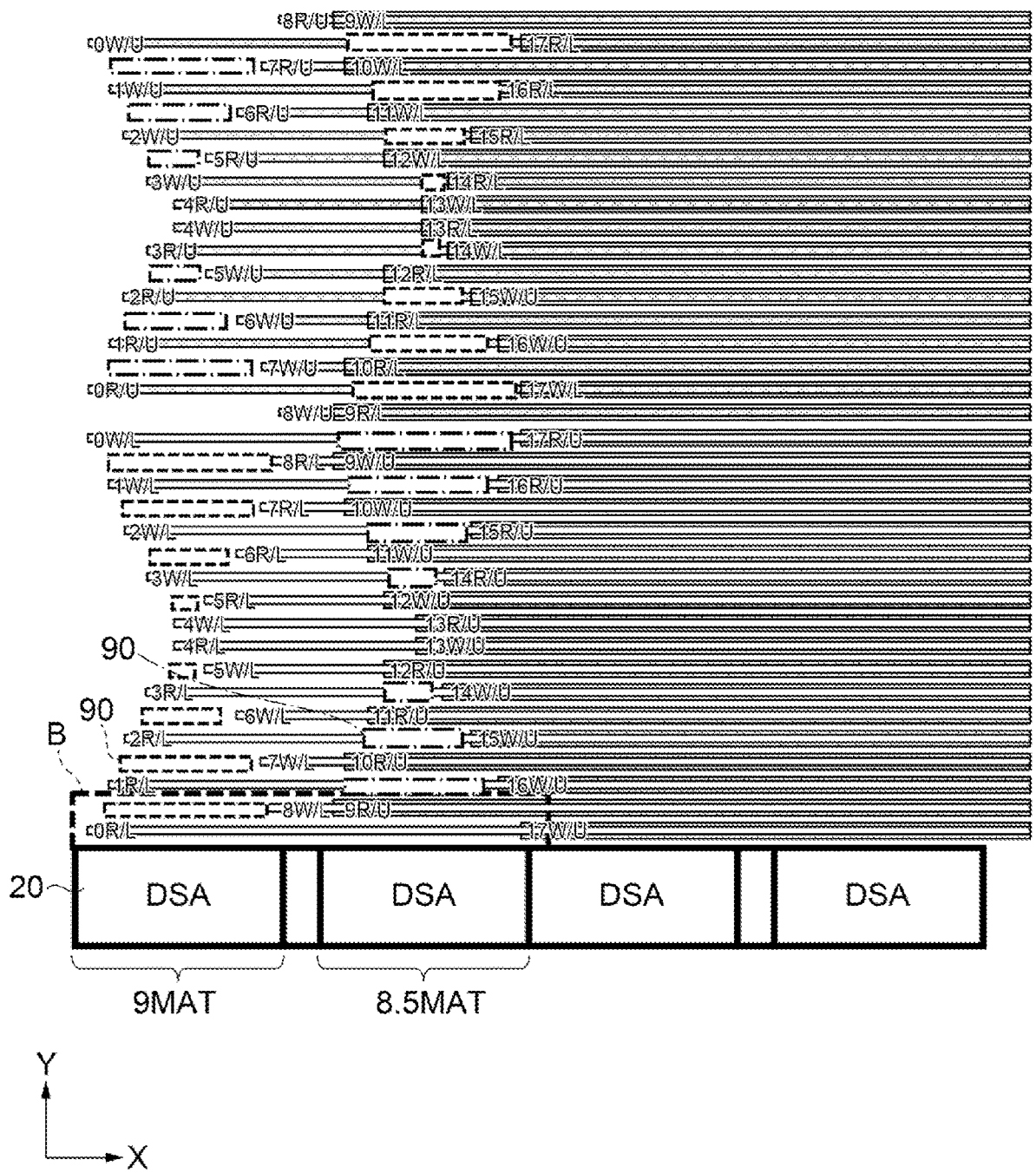
FIG. 7A is a schematic diagram showing the read data buses and the write data buses while being overlaid.
Figure 7B:
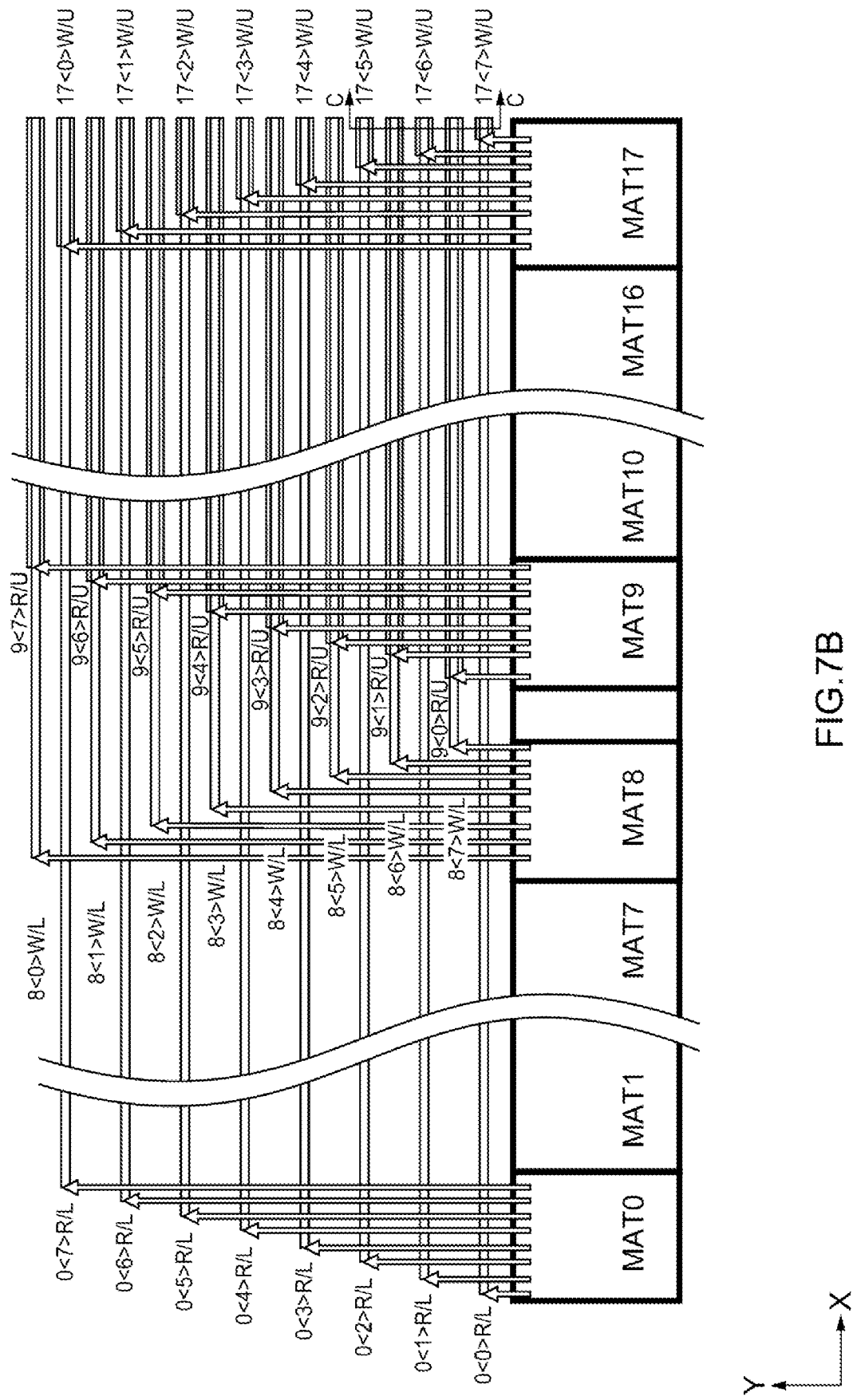
FIG. 7B is an enlarged view of a region B in FIG. 7A.

FIG. 7A is a schematic diagram showing the read data buses LBUSR and the write data buses LBUSW assigned to the bank group BGA while those buses are overlaid. FIG. 7B is an enlarged view of a region B in FIG. 7A. For making the drawing easily viewable, FIG. 7A only shows, for each mat, one of eight read data buses LBUSR corresponding to the Lower DQ, one of eight read data buses LBUSR corresponding to the Upper DQ, one of eight write data buses LBUSW corresponding to the Lower DQ, and one of eight write data buses LBUSW corresponding to the Upper DQ. Further, as for reference signs given to the read data buses LBUSR and the write data buses LBUSW in FIG. 7A, the leading number indicates a corresponding memory mat, characters R and W indicate the read data bus LBUSR and the write data bus LBUSW, respectively, and characters L and U indicate the Lower DQ and the Upper DQ, respectively. Therefore, a reference sign 0R/L in FIG. 7A means that the bus is the read data bus LBUSR corresponding to the memory mat MAT0 and belongs to the Lower DQ. Additionally, in some examples, signs <0> to <7> added in FIG. 7B mean eight read data buses LBUSR or eight write data buses LBUSW that correspond to the same memory mat.

As shown in FIG. 7A, read data buses 0R/L to 8R/L and write data buses 8W/L to 0W/L arranged in the wiring layer M4 are alternately arranged in the Y-direction (e.g., vertical direction and/or perpendicular to the X-direction), the read data buses 0R/L to 8R/L are arranged in long order (e.g. from longest to shortest), and the write data buses 8W/L to 0W/L are arranged in short order (e.g. from shortest to longest). In some examples, the read data buses 0R/L to 8R/L and write data buses 8W/L to 0W/L may be arranged in parallel in the Y-direction. Read data buses 9R/L to 17R/L and write data buses 17W/L to 9W/L arranged in the wiring layer M4 are alternately arranged in the Y-direction (e.g., vertical direction), the read data buses 9R/L to 17R/L are arranged in long order (e.g. from longest to shortest), and the write data buses 17W/L to 9W/L are arranged in short order (e.g. from shortest to longest). In some examples, the read data buses 9R/L to 17R/L and write data buses 17W/L to 9W/L may be arranged in parallel in the Y-direction. Read data buses 0R/U to 8R/U and write data buses 8W/U to 0W/U arranged in the wiring layer M5 are alternately arranged in the Y-direction (e.g. vertical direction and/or perpendicular to the X-direction), the read data buses 0R/U to 8R/U are arranged in long order (e.g. from longest to shortest), and the write data buses 8W/U to 0W/U are arranged in short order (e.g. from shortest to longest). In some examples, the read data buses 0R/U to 8R/U and write data buses 8W/U to 0W/U may be arranged in parallel in the Y-direction. Portions of the read data buses 0R/U to 8R/U arranged in the wiring layer M5 are respectively arranged to overlap portions of the write data buses 17W/L to 9W/L arranged in the wiring layer M4. Further, portions of the write data buses 8W/U to 0W/U arranged in the wiring layer M5 are respectively arranged to overlap portions of the read data buses 9R/L to 17R/L arranged in the wiring layer M4. Read data buses 9R/U to 17R/U and write data buses 17W/U to 9W/U arranged in the wiring layer M5 are alternately arranged in the Y-direction (e.g. a vertical direction and/or a direction perpendicular to the X-direction), the read data buses 9R/U to 17R/U are arranged in long order (e.g. from longest to shortest), and the write data buses 17W/U to 9W/U are arranged in short order (e.g. from shortest to longest). In some examples, the read data buses 9R/U to 17R/U and write data buses 17W/U to 9W/U may be arranged in parallel in the Y-direction. Portions of the write data buses 17W/U to 9W/U arranged in the wiring layer M5 are respectively arranged to overlap portions of the read data buses 0R/L to 8R/L arranged in the wiring layer M4. Further, portions of the read data buses 9R/U to 17R/U arranged in the wiring layer M5 are respectively arranged to overlap portions of the write data buses 8W/L~0W/L arranged in the wiring layer M4. In this configuration, the read data buses LBUSR or the write data buses LBUSW are not adjacent to each other in the vertical direction (e.g. Y-direction) and in the planar direction (e.g. X-direction), as described with reference to FIG. 5. Therefore, coupling between the read data buses LBUSR and coupling between the write data buses LBUSW are reduced. FIG. 5 corresponds to a C-C section shown in FIG. 7B.

Further, as shown in FIG. 7A, shield patterns 90 shown with a broken line are arranged in empty regions of the wiring layers M4 and M5. For example, in the wiring layer M4, the shield patterns 90 are arranged between the read data bus 0R/L and the read data bus 1R/L and between the read data bus 1R/L and the read data bus 2R/L, respectively. In the wiring layer M5, the shield patterns 90 are respectively arranged between the read data bus 9R/U and the read data bus 10R/U and between the read data bus 10R/U and the read data bus 11R/U, for example. With this configuration, the read data buses LBUSR or the write data buses LBUSW are not adjacent to each other via an empty region, and the shield pattern 90 is arranged between the data buses LBUSR or LBUSW. Therefore, coupling between the read data buses LBUSR and coupling between the write data buses LBUSW can be further reduced. A fixed potential, for example, a ground potential VSS may be applied to the shied pattern 90. The shield pattern 90 is arranged on the extension in the X-direction of a corresponding read data bus LBUSR or a corresponding write data bus LBUSW. For example, the shield pattern 90 between the read data bus 0R/L and the read data bus 1R/L is arranged on the extension in the X-direction of the corresponding write data bus 8W/L. Further, the shield pattern 90 between the read data bus 1R/L and the read data bus 2R/L is arranged on the extension in the X-direction of the corresponding write data bus 7W/L. Since the write data bus 8W/L and the write data bus 7W/L are different from each other in length, the lengths in the X-direction of the shield patterns 90 corresponding thereto are also different from each other.

As described above, in the present embodiment, the wiring layer M4 is used for wires for the Lower DQ that have shorter wiring distances among the read data buses LBUSR and the write data buses LBUSW assigned to the bank group BGA, and the wiring layer M5 having a lower resistance is used for wires for the Upper DQ that have longer wiring distances. Therefore, a difference between wire resistances caused by a difference between the wiring distances can be reduced. Conversely, in the bank group BGB, wires for the Lower DQ are longer than wires for the Upper DQ. Therefore, it suffices that the wiring layer M4 is used for the wires for the Upper DQ that have shorter wiring distances, and the wiring layer M5 is used for the wires for the Lower DQ that have longer wiring distances. Further, the read data buses 0R/L to 8R/L are arranged in the Y-direction in this order, and the write data buses 8W/L to 0W/L are arranged in the Y-direction in this order, for example. Therefore, a section where wires are adjacent to each other in the planar direction becomes shorter, and overall coupling is thus reduced.

Figure 8:
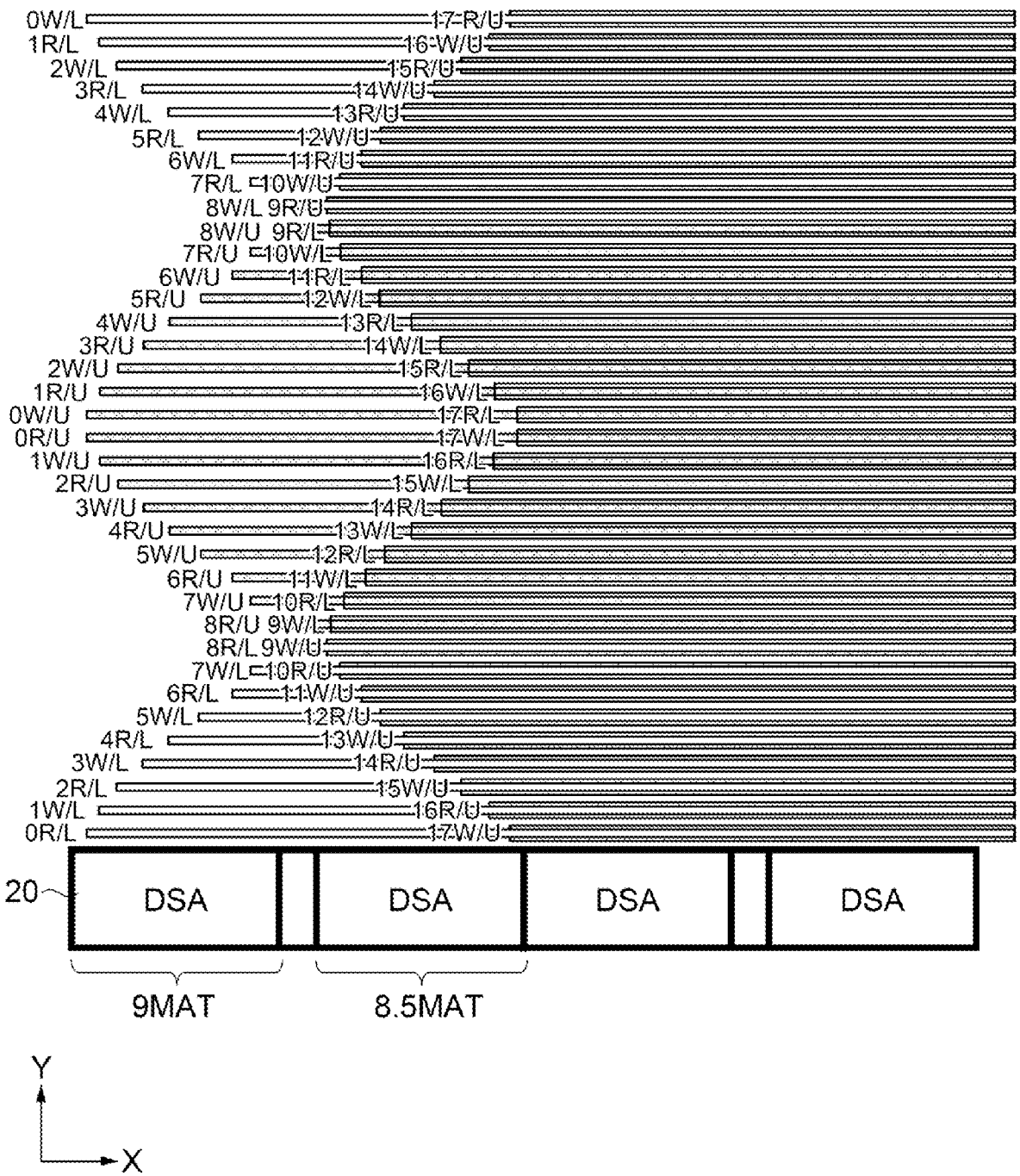
FIG. 8 is a schematic diagram showing a layout of read data buses and write data buses according to a modification.

FIG. 8 is a schematic diagram showing a layout of the read data buses LBUSR and the write data buses LBUSW assigned to the bank group BGA according to a modification. FIG. 8 also only shows, for one mat, only one of eight read data buses LBUSR corresponding to the Lower DQ, one of eight read data buses LBUSR corresponding to the Upper DQ, one of eight write data buses LBUSW corresponding to the Lower DQ, and one of eight write data buses LBUSW corresponding to the Upper DQ, for making the drawing easily viewable. The meanings of the reference signs in FIG. 8 are also the same as those in FIG. 7A.

In the example shown in FIG. 8, the read data buses 0R/L to 17R/L and 0R/U to 17R/U and the write data buses 0W/L to 17W/L and 0W/U to 17W/U are grouped into odd numbered wires and even numbered wires. Even numbered read data buses 0R/L, 2R/L, 4R/L, . . . , and 16R/L and odd numbered write data buses 1W/L, 3W/L, 5W/L, . . . , and 17W/L are alternately arranged in the Y-direction in the wiring layer M4. These wires are arranged to become shorter as the distance from the data sense amplifiers 20 becomes larger. Further, even numbered write data buses 0W/L, 2W/L, 4W/L, . . . , and 16W/L and odd numbered read data buses 1R/L, 3R/L, 5R/L, . . . , and 17R/L are alternately arranged in the Y-direction in the wiring layer M4. These wires are arranged to become longer as the distance from the data sense amplifiers 20 becomes larger. Furthermore, even numbered read data buses 0R/U, 2R/U, 4R/U, . . . , and 16R/U and odd numbered write data buses 1W/U, 3W/U, 5W/U, . . . , and 17W/U are alternately arranged in the Y-direction in the wiring layer M5. These wires are arranged to become longer as the distance from the data sense amplifiers 20 becomes larger. Even numbered write data buses 0W/U, 2W/U, 4WU, . . . , and 16W/U and odd numbered read data buses 1R/U, 3R/U, 5R/U, . . . , and 17R/U are alternately arranged in the Y-direction in the wiring layer M5. These wires are arranged to become shorter as the distance from the data sense amplifiers 20 becomes larger. In some examples, "alternatively arranged in the Y-direction" may be parallel in a vertical direction and/or a direction perpendicular to the X-direction.

In this layout, since the read data buses LBUSR or the write data buses LBUSW are not adjacent to each other via an empty region, it is no longer necessary to use the shield pattern 90. Consequently, a total capacitance added to the read data buses LBUSR and the write data buses LBUSW is further reduced. In addition, the positions in the Y-direction of the odd numbered wires and those of the even numbered wires are largely different from each other. Therefore, also regarding wires extending in the Y-direction and using the wiring layer M3, a section in which wires are adjacent to each other in the X-direction is reduced. Accordingly, the capacitance generated in the wiring layer M3 is also reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a plurality of first data amplifiers arranged in line in a first direction;
a plurality of first read data buses each coupled to a corresponding one of the plurality of first data amplifiers, each of the plurality of first read data buses having different lengths from one another; and
a plurality of first write data buses each coupled to the corresponding one of the plurality of first data amplifiers, each of the plurality of first write data buses having a different length from one another,
wherein the plurality of first read data buses and the plurality of first write data buses are alternately arranged in parallel in a second direction perpendicular to the first direction, and
wherein the first read data buses of the plurality of first read data buses are arranged in an order from longest to shortest and the first write data buses of the plurality of first write data buses are arranged in an order from shortest to longest.

2. The apparatus of claim 1, wherein the plurality of first read data buses and the plurality of first write data buses are located on a first wiring layer.

3. The apparatus of claim 2, further comprising a plurality of first shield patterns located on the first wiring layer,
wherein each of the plurality of first shield patterns is arranged in an extension of a corresponding one of the plurality of first write data buses in the first direction and arranged between adjacent two of the plurality of first read data buses in the second direction.

4. The apparatus of claim 3, wherein each of the plurality of first shield patterns has a different length from one another.

5. The apparatus of claim 3, further comprising a plurality of second shield patterns located on the first wiring layer,
wherein each of the plurality of second shield patterns is arranged in an extension of a corresponding one of the plurality of first read data buses in the first direction and arranged between adjacent two of the plurality of first write data buses in the second direction.

6. The apparatus of claim 5, wherein each of the plurality of second shield patterns has a different length from one another.

7. The apparatus of claim 2, further comprising:
a plurality of second read data buses each coupled to the corresponding one of the plurality of first data amplifiers, each of the plurality of second read data buses having a different length from one another; and
a plurality of second write data buses each coupled to the corresponding one of the plurality of first data amplifiers, each of the plurality of second write data buses having a different length from one another,
wherein the plurality of second read data buses and the plurality of second write data buses are alternately arranged in parallel in the second direction,
wherein the plurality of second read data buses are arranged in the order from longest to shortest and the plurality of second write data buses are arranged in the order from shortest to longest, and
wherein the plurality of second read data buses and the plurality of second write data buses are located on a second wiring layer different from the first wiring layer.

8. The apparatus of claim 7, wherein the plurality of first read data buses and the plurality of first write data buses do not overlap with the plurality of second read data buses and the plurality of second write data buses.

9. The apparatus of claim 8, further comprising:
a plurality of second data amplifiers arranged in line in the first direction;
a plurality of third read data buses each coupled to a corresponding one of the plurality of second data amplifiers, each of the plurality of third read data buses having a different length from one another; and
a plurality of third write data buses each coupled to the corresponding one of the plurality of second data amplifiers, each of the plurality of third write data buses having a different length from one another,
wherein the plurality of third read data buses and the plurality of third write data buses are alternately arranged in parallel in the second direction,
wherein the plurality of third read data buses are arranged in the order from longest to shortest r and the plurality of third write data buses are arranged in the order from shortest to longest,
wherein the plurality of third read data buses and the plurality of third write data buses are located on the second wiring layer,
wherein at least one of the plurality of third read data buses overlaps with a corresponding one of the plurality of first write data buses, and
wherein at least one of the plurality of third write data buses overlaps with a corresponding one of the plurality of first read data buses.

10. The apparatus of claim 9, further comprising:
a plurality of fourth read data buses each coupled to the corresponding one of the plurality of second data amplifiers, each of the plurality of fourth read data buses having a different length from one another; and
a plurality of fourth write data buses each coupled to the corresponding one of the plurality of second data amplifiers, each of the plurality of fourth write data buses having a different length from one another,
wherein the plurality of fourth read data buses and the plurality of fourth write data buses are alternately arranged in parallel in the second direction,
wherein the plurality of fourth read data buses are arranged in the order from longest to shortest and the plurality of fourth write data buses are arranged in the order from shortest to longest,
wherein the plurality of fourth read data buses and the plurality of fourth write data buses are located on the first wiring layer,
wherein at least one of the plurality of second read data buses overlaps with a corresponding one of the plurality of fourth write data buses, and wherein at least one of the plurality of second write data buses overlaps with a corresponding one of the plurality of fourth read data buses.

11. The apparatus of claim 10, further comprising:
a plurality of first data I/O terminals coupled to the plurality of first and fourth read data buses and the plurality of first and fourth write data buses; and
a plurality of second data I/O terminals coupled to the plurality of second and third read data buses and the plurality of second and third write data buses.

12. An apparatus comprising:
a plurality of first data amplifiers arranged in line in a first direction, the plurality of first data amplifiers including a plurality of odd numbered first data amplifiers and a plurality of even numbered first data amplifiers;
a plurality of odd numbered first read data buses each coupled to a corresponding one of the plurality of odd numbered first data amplifiers, each of the plurality of odd numbered first read data buses having a different length from one another;
a plurality of even numbered first read data buses each coupled to a corresponding one of the plurality of even numbered first data amplifiers, each of the plurality of even numbered first read data buses having a different length from one another;
a plurality of odd numbered first write data buses each coupled to the corresponding one of the plurality of odd numbered first data amplifiers, each of the plurality of odd numbered first write data buses having a different length from one another; and
a plurality of even numbered first write data buses each coupled to the corresponding one of the plurality of even numbered first data amplifiers, each of the plurality of even numbered first write data buses having a different length from one another,
wherein the plurality of odd numbered first read data buses and the plurality of even numbered first write data buses are alternately arranged in parallel in a second direction perpendicular to the first direction, and
wherein the plurality of even numbered first read data buses and the plurality of odd numbered first write data buses are alternately arranged in parallel in the second direction.

13. The apparatus of claim 12,
wherein the plurality of odd numbered first read data buses and the plurality of even numbered first write data buses are arranged in an order from shortest to longest, and
wherein the plurality of even numbered first read data buses and the plurality of odd numbered first write data buses are arranged in an order from longest to shortest.

14. The apparatus of claim 13, wherein the plurality of odd and even numbered first read data buses and the plurality of odd and even numbered first write data buses are located on a first wiring layer.

15. The apparatus of claim 14, further comprising:
a plurality of odd numbered second read data buses each coupled to the corresponding one of the plurality of odd numbered first data amplifiers, each of the plurality of odd numbered second read data buses having a different length from one another;
a plurality of even numbered second read data buses each coupled to the corresponding one of the plurality of even numbered first data amplifiers, each of the plurality of even numbered second read data buses having a different length from one another;
a plurality of odd numbered second write data buses each coupled to the corresponding one of the plurality of odd numbered first data amplifiers, each of the plurality of odd numbered second write data buses having a different length from one another; and
a plurality of even numbered second write data buses each coupled to the corresponding one of the plurality of even numbered first data amplifiers, each of the plurality of even numbered second write data buses having a different length from one another,
wherein the plurality of odd numbered second read data buses and the plurality of even numbered second write data buses are alternately arranged in parallel in the second direction, and
wherein the plurality of even numbered second read data buses and the plurality of odd numbered second write data buses are alternately arranged in parallel in the second direction,
wherein the plurality of odd numbered second read data buses and the plurality of even numbered second write data buses are arranged in the order from longest to shortest,
wherein the plurality of even numbered second read data buses and the plurality of odd numbered second write data buses are arranged in the order from shortest to longest, and
wherein the plurality of odd and even numbered second read data buses and the plurality of odd and even numbered second write data buses are located on a second wiring layer different from the first wiring layer.

16. The apparatus of claim 15, wherein the plurality of odd and even numbered first read data buses and the plurality of odd and even numbered first write data buses do not overlap with the plurality of odd and even numbered second read data buses and the plurality of odd and even numbered second write data buses.

17. The apparatus of claim 16, further comprising:
a plurality of second data amplifiers arranged in line in the first direction, the plurality of second data amplifiers including a plurality of odd numbered second data amplifiers and a plurality of even numbered second data amplifiers;
a plurality of odd numbered third read data buses each coupled to a corresponding one of the plurality of odd numbered second data amplifiers, each of the plurality of odd numbered third read data buses having a different length from one another;
a plurality of even numbered third read data buses each coupled to a corresponding one of the plurality of even numbered second data amplifiers, each of the plurality of even numbered third read data buses having a different length from one another;
a plurality of odd numbered third write data buses each coupled to the corresponding one of the plurality of odd numbered second data amplifiers, each of the plurality of odd numbered third write data buses having a different length one another; and
a plurality of even numbered third write data buses each coupled to the corresponding one of the plurality of even numbered second data amplifiers, each of the plurality of even numbered third write data buses having a different length from one another,
wherein the plurality of odd numbered third read data buses and the plurality of even numbered third write data buses are alternately arranged in parallel in the second direction, and wherein the plurality of even numbered third read data buses and the plurality of odd numbered third write data buses are alternately arranged in parallel in the second direction, wherein the plurality of odd numbered third read data buses and the plurality of even numbered third write data buses are arranged in the order from longest to shortest, wherein the plurality of even numbered third read data buses and the plurality of odd numbered third write data buses are arranged in the order from shortest to longest, wherein the plurality of odd and even numbered third read data buses and the plurality of odd and even numbered third write data buses are located on the second wiring layer, wherein at least one of the plurality of odd and even numbered third read data buses overlaps with a corresponding one of the plurality of odd and even numbered first write data buses, and wherein at least one of the plurality of odd and even numbered third write data buses overlaps with a corresponding one of the plurality of odd and even numbered first read data buses.

18. The apparatus of claim 17, further comprising:

a plurality of odd numbered fourth read data buses each coupled to the corresponding one of the plurality of odd numbered second data amplifiers, each of the plurality of odd numbered fourth read data buses having a different length from one another;

a plurality of even numbered fourth read data buses each coupled to the corresponding one of the plurality of even numbered second data amplifiers, each of the plurality of even numbered fourth read data buses having a different length one another;

a plurality of odd numbered fourth write data buses each coupled to the corresponding one of the plurality of odd numbered second data amplifiers, each of the plurality of odd numbered fourth write data buses having a different length from one another; and a plurality of even numbered fourth write data buses each coupled to the corresponding one of the plurality of even numbered second data amplifiers, each of the plurality of even numbered fourth write data buses having a different length from one another, wherein the plurality of odd numbered fourth read data buses and the plurality of even numbered fourth write data buses are alternately arranged in parallel in the second direction, and wherein the plurality of even numbered fourth read data buses and the plurality of odd numbered fourth write data buses are alternately arranged in parallel in the second direction, wherein the plurality of odd numbered fourth read data buses and the plurality of even numbered fourth write data buses are arranged in the order from shortest to longest, wherein the plurality of even numbered fourth read data buses and the plurality of odd numbered fourth write data buses are arranged in the order from longest to shortest, wherein the plurality of odd and even numbered fourth read data buses and the plurality of odd and even numbered fourth write data buses are located on the first wiring layer, wherein at least one of the plurality of odd and even numbered second read data buses overlaps with a corresponding one of the plurality of odd and even numbered fourth write data buses, and wherein at least one of the plurality of odd and even numbered second write data buses overlaps with a corresponding one of the plurality of odd and even numbered fourth read data buses.

19. An apparatus comprising:

first, second, third, and fourth memory mats;

first and second read data buses coupled to the first memory mats;

first and second write data buses coupled to the second memory mats;

third and fourth read data buses coupled to the third memory mats; and third and fourth write data buses coupled to the fourth memory mats, wherein the first, second, third, and fourth read data buses and the first, second, third, and fourth write data buses extend in parallel with one another, wherein the first and second read data buses and the first and second write data buses are located on a first wiring layer, wherein the third and fourth read data buses and the third and fourth write data buses are located on a second wiring layer different from the first wiring layer, wherein the first write data bus is arranged between the first and second read data buses, wherein the second read data bus is arranged between the first and second write data buses, wherein the third read data bus is arranged between the third and fourth write data buses, wherein the fourth write data bus is arranged between the third and fourth read data buses, wherein the third write data bus extends in parallel to and above the first read data bus, wherein the third read data bus extends in parallel to and above the first write data bus, wherein the fourth write data bus extends in parallel to and above the second read data bus, and wherein the fourth read data bus extends in parallel to and above the second write data bus.

20. The apparatus of claim 19, further comprising:

a fifth read data buses coupled to the first memory mats; and a fifth write data buses coupled to the fourth memory mats, wherein the second write data bus is arranged between the second and fifth read data buses, wherein the fourth read data bus is arranged between the fourth and fifth write data buses, and wherein the fifth write data bus extends in parallel to and above the fifth read data bus.

* * * * *